United States Patent [19]

Iyer et al.

[11] Patent Number: 5,726,391

[45] Date of Patent: Mar. 10, 1998

[54] THERMOSETTING ENCAPSULANTS FOR ELECTRONICS PACKAGING

[75] Inventors: Shridhar R. Iyer, Sugar Land; Pui Kwan Wong, Houston, both of Tex.

[73] Assignee: Shell Oil Company, Houston, Tex.

[21] Appl. No.: 768,056

[22] Filed: Dec. 16, 1996

[51] Int. Cl.$^6$ ............................................. H01L 23/28
[52] U.S. Cl. .................. 174/52.2; 174/52.4; 264/272.17; 264/272.11; 257/788
[58] Field of Search .......................... 174/52.2, 52.4; 257/787, 788; 264/272.17, 272.11

[56] References Cited

U.S. PATENT DOCUMENTS

| | | | |
|---|---|---|---|
| 5,288,769 | 2/1994 | Papageorge et al. | 523/200 |
| 5,371,328 | 12/1994 | Gutierrez et al. | 174/261 |
| 5,641,856 | 6/1997 | Meurs | 528/310 |

OTHER PUBLICATIONS

"Cleavable Epoxy Resins: Design for Disassembly of a Thermoset," by S. L. Buchwalter and L. L. Kosbar, *Journal of PolymerScience: Part A: Polymer Chemistry*, vol. 34, pp. 249–260 (1996).

*Primary Examiner*—Kristine L. Kincaid
*Assistant Examiner*—Kristina Soderquist

[57] ABSTRACT

An electronic package is provided where in a semiconductor device on a substrate is encapsulated with a thermally reworkable encapsulant composition including:

(a) a thermally reworkable crosslinked resin produced by reacting at least one dienophile having a functionality greater than one and at least one 2,5-dialkyl substituted furan-containing polymer, and (b) at least one filler present from about 25 to about 75 percent by weight based upon the amount of components (a) and (b). Such a process provides a readily reworkable electronic package.

33 Claims, No Drawings

THERMOSETTING ENCAPSULANTS FOR ELECTRONICS PACKAGING

FIELD OF THE INVENTION

This invention relates to thermosetting encapsulants. In one aspect, the invention relates to thermosetting encapsulants suitable for use in electronics packaging.

BACKGROUND OF THE INVENTION

Chip On Board (COB) technology involves adhering a semiconductor device on a substrate by means of an adhesive and encapsulating the entire device and part of the substrate with an encapsulant, usually an epoxy-based system. Electrically conductive connections can be made from the device to metal circuit traces on the substrate by means of gold, tin-plated copper or aluminum wires by wire bonding or tape automated bonding. The dispensing of the glob-top encapsulant is done in one of two ways: (1) The encapsulant is dispensed over the device and part of the substrate to form a protective layer. (2) A thixotropic or low-flowing encapsulant is dispensed on the substrate to form a dam. A lower viscosity encapsulant is then dispensed inside the dam to protect the device.

Historically, glob top encapsulants were used in inexpensive applications such as digital watches and video games where rework was not a major issue. Recently, they are beginning to see increasing use in higher density applications for more expensive chips and substrates where repair and rework are important issues. For instance, in some ball grid array (BGA) and pin grid array (PGA) applications, liquid encapsulants are used to protect the chip like a COB package while pins or solder balls are used to make the connection between the chip substrate and the printed circuit board. In addition, the package may consist of multiple chips arranged close to each other on a common substrate. Glob top encapsulants are also finding use in expensive multi-component printed circuit boards that cannot be thrown away if defective devices are found during testing and electrical inspection. A conventional encapsulant is a thermosetting system that is irreversibly crosslinked after it is dispensed on the chip. An example formulation of conventional encapsulant is a liquid epoxy resin such as a bisphenol-A epoxy, a curing agent such as an anhydride with a suitable accelerator, and other additives.

Rework of the semiconductor device with a glob top encapsulant is difficult and time consuming and is only possible by destructive methods such as grinding and die shear. Thus it is desirable to provide a method which allows the reworking to be more readily processable.

SUMMARY OF THE INVENTION

According to the invention, a thermally reworkable electronic package is provided comprising:
- a substrate having a metal circuit pattern disposed on a first surface thereof;
- at least one semiconductor device attached to a substrate by means of a die attach adhesive, preferably a thermally reworkable die attach composition;
- at least one electrically conductive connection; and
- a thermally reworkable encapsulant covering the semiconductor device and a portion of the surface of the substrate;
- said thermally reworkable encapsulant comprising
  (a) a thermally reworkable crosslinked resin produced by reacting at least one dienophile having a functionality greater than one and at least one 2,5-dialkyl substituted furan-containing polymer, and
  (b) at least one filler present in an amount from about 25 to about 75 percent by weight based upon the amount of components (a) and (b) thereby providing an electronic package.

Such an electronic package can be readily reworked.

DETAILED DESCRIPTION OF THE INVENTION

There may be several ways by which the polymer chains of the thermally reworkable crosslinked resin can be produced. The thermally reworkable crosslinked resin can be produced by reacting at least one dienophile having a functionality greater than one and at least one 2,5-dialkyl substituted furan-containing polymer connecting to one another via Diels-Alder addition. In one embodiment the 2,5-dialkyl substituted furan groups are attached to or form part of the polymer chains.

The reversible furan to dienophile reaction to form the Diels-Alder reaction can be represented by:

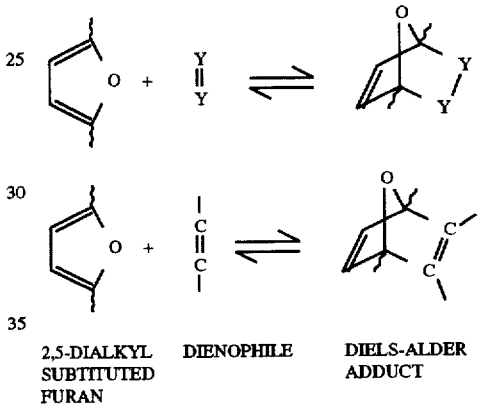

2,5-DIALKYL SUBTITUTED FURAN    DIENOPHILE    DIELS-ALDER ADDUCT where Y is either C< or N—. For a thermally reworkable crosslinked resin, all or a portion of the Diels-Alder adduct can revert to the furan and dienophile upon heating such that the resin becomes a liquid (flowable material).

A crosslinking agent which contains in its molecular structure two or more dienophiles can also be used in this embodiment. These dienophiles are connected to each other by chemical bonds or by bridging groups. Accordingly, the present invention also contemplates a reworkable encapsulant composition containing a polymer which comprises moieties of a 2,5-dialkyl substituted furan and a crosslinking agent which comprises two or more dienophiles in its molecular structure. The dienophiles may also be attached to or form part of the polymer chains. Crosslinking agent which comprises in its molecular structure two or more 2,5-dialkyl substituted furan groups can also be used.

In yet another embodiment the dienophile is attached to the polymer chains to which the 2,5-dialkyl substituted furan groups are also attached or which contain the 2,5-dialkyl substituted furan groups as a part of their polymer chains. Accordingly, the 2,5-dialkyl substituted furan-containing polymer can also contain moieties of a 2,5-dialkyl substituted furan and moieties of a dienophile.

The 2,5-dialkyl substituted furans may or may not be substituted at their 3- and 4-positions. Preferred substituents are inert substituents such as for example alkyl or alkyloxy groups, typically having up to 10 carbon atoms, such as methyl, ethyl, 1-propyl, methoxy and 1-hexyloxy groups.

Resins containing furans whose 2 and 5 positions are not substituted are susceptible to side reactions which can cause irreversible gelling and interfere with its reversibility.

The 2,5-dialkyl substituted furan groups may be attached to the polymer chains of the polymer(s) on which the crosslinked resin is based. They may be attached thereto directly via a chemical bond or via a divalent organic bridging group for which any of the substituents of the furans or the 3- or 4-positions of the furans may function as the point of attachment. The alkyl substituents at the 2- and 5-positions of the furans may be the same or different and will typically have up to 10 carbon atoms. Examples of suitable alkyl groups are methyl, ethyl, 2-propyl and 1-hexyl groups. Examples of suitable furyl groups which can be attached to a polymer chain are 2,5-dimethylfur-3-yl, 2,5-diethyl-3-methyl-fur-4-yl, 5-ethylfurfuryl or 5-(1-butyl) furfuryl groups.

The type of polymer chains to which the 2,5-dialkyl substituted furan groups may be attached is not critical. Suitably the polymer chains are chains of a polyolefin, such as polyethene, polypropene, polystyrene, poly(acrylic acid) or a copolymer of ethene and acrylic acid or ester, chains of random or alternating copolymers of carbon monoxide and olefinically unsaturated compounds (for a further elaboration on such copolymers cf. hereinafter), or chains which contain heteroatoms, such as chains of polyamide or polyester. It is preferred that the 2,5-dialkyl substituted furans form a structural element of the polymer backbone itself. In such a case it is particularly preferred that each of the 2,5-dialkyl substituents of the furans are alkylene groups which also form part of the polymer chain and which may or may not be substituted.

Such a structure can be produced by furanizing copolymers of carbon monoxide and olefinically unsaturated compounds which contain 1,4-dicarbonyl entities in their polymer chains, i.e. by converting such 1,4-dicarbonyl entities into furan moieties. Alternatively, a 2,5-dialkyl substituted furan-containing polymer can be directly produced by reacting carbon monoxide and olefinically unsaturated compounds in the presence of a strong acid.

Perfectly alternating copolymers of carbon monoxide and olefinically unsaturated compounds which contain 1,4-dicarbonyl entities in their polymer chains are known. They can be prepared by palladium catalyzed polymerization using the methods known from, for example, EP-A-121965, EP-A-181014 and EP-A-516238. The polymers so prepared are alternating copolymers of carbon monoxide and the olefinically unsaturated compounds, i.e. copolymers of which the polymer chains contain the monomer units originating in carbon monoxide (i.e. carbonyl groups) and the monomer units originating in the olefinically unsaturated compounds in an alternating arrangement so that every fourth carbon atom of the polymer chain belongs to a carbonyl group. Alternative copolymers of carbon monoxide and olefinically unsaturated compounds which contain 1,4-dicarbonyl entities may be random copolymers, i.e. copolymers of which the polymer chains contain monomer units in a random order. The latter copolymers can be prepared by radical initiated polymerization using the methods known from, e.g., U.S. Pat. No. 2,495,286 and U.S. Pat. No. 4,024,326.

The furanization of the copolymer of carbon monoxide and olefinically unsaturated compounds may be effected by methods known in the art, for example, by applying phosphorus pentoxide as dehydrating agent, as disclosed by A. Sen et al. (J. Polym. Science, Part A. Polym. Chem. 32 (1994)p. 841), or by heating in the presence of a strong acid, such as p-toluenesulphonic acid, as disclosed in U.S. Pat. No. 3,979,373. These methods allow the conversion of 1,4-dicarbonyl moieties in the polymer chains into furan moieties at a variable conversion level, depending upon the reaction conditions selected.

It is preferred to employ in the furanization an alternating copolymer of carbon monoxide and olefinically unsaturated compounds because these have a higher content of 1,4-dicarbonyl groups in the polymer back-bone so that the furanization can be accomplished efficiently at a high level of incorporation of furan groups. If, nevertheless, a low degree of furanization is desired, the conversion of carbonyl groups into furan groups may be kept low.

The copolymers of carbon monoxide and olefinically unsaturated compounds may be based on hydrocarbons as the olefinically unsaturated compounds. It is preferred that the copolymer is based on an olefinically unsaturated hydrocarbon, suitably an α-olefin, in particular an α-olefin having up to 10 carbon atoms. Very suitable are aliphatic α-olefins, in particular those having from 3 to 6 carbon atoms and more in particular those having a straight carbon chain, such as propene, 1-butene, 1-pentene and 1-hexene. Propene is most preferred. The copolymer can be regioregular or irregular, stereoregular or atactic.

A 2,5-dialkyl substituted furan-containing polymer where a polymer based on propene and carbon monoxide are furanized can be represented by the formula:

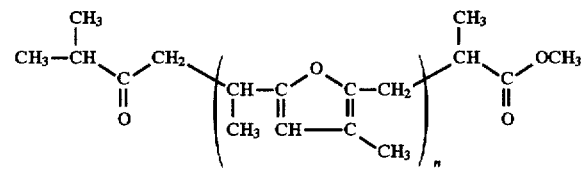

The precise nature of the dienophile from which the Diels-Alder adduct is obtained is not critical, as long as the Diels-Alder adduct has such a thermal stability that the crosslinked resin is reworkable. Usually the minimum temperature above which the reworkable crosslinked resin will be reworked depends on the maximum temperature requirements for the semiconductor device used. The reworking is suitably carried out at a temperature from about 100° C., preferably from about 130° C., to about 250° C., preferably to about 200° C.

Suitable dienophile functionality can be represented by Y=Y where Y is either C< or N—, or —C≡C—. Preferably the dienophiles are, for example, alkynes having electron withdrawing groups attached to both sides of the ethyne moiety, such as ester and keto groups. Examples are mono- and diesters of butynedioic acid (i.e. acetylenedicarboxylic acid) and substituted but-2-yne-1,4-diones. Other suitable dienophiles are compounds which contain a but-2-ene-1,4-dione moiety included in a 5- or 6-membered ring, in particular compounds of the general formula:

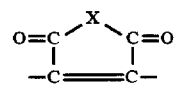

wherein X denotes O, S, N, P, or R where R is alkylene, wherein at least one of the free valencies is occupied by a bridging group which connects the dienophile with one of the polymer chains or with another dienophile, and wherein the remaining valencies, if any, are occupied by lower alkyl or acyl substituents or, preferably, hydrogen. The lower alkyl substituents suitably contain up to 4 carbon atoms and are, for example, methyl or ethyl groups. Dienophiles of this general formula are preferably cyclic derivatives of maleic anhydride and, in particular, maleimide (i.e. X denotes O or, in particular, N—).

Examples of other suitable dienophiles include, bis (triazolinediones), bis(phthalazinediones), quinones, bis (tricyanoethylenes), bis(azodicarboxylates); diacrylates, maleate or fumarate polyesters, acetylenedicarboxylate polyesters.

As indicated hereinbefore, in one embodiment use is made of a crosslinking agent which comprises in its molecular structure two or more dienophiles from which the Diels-Alder adducts are obtainable. The dienophiles may be connected to each other by one or more bridging groups. For example, three dienophiles may be connected to one another by a trivalent bridging group. However, it is sufficient that a crosslinking agent is used in which two dienophiles are connected to one another by a bivalent bridging group. The dienophiles may also be connected to one another by chemical bonds.

Both the molecular weight and the chemical nature of the bridging group of the crosslinking agent may be varied to a large extent. It has been found that such variations of the crosslinking agent lead to re-moldable crosslinked resins covering a wide range of mechanical properties. The bridging group may contain only carbon atoms in the bridge but it is also possible that it contains heteroatoms in the bridge, such as oxygen, silicon or nitrogen atoms. The bridging group may be flexible or rigid.

For example, polymeric bridging groups having flexible polymer chains, such as poly(alkylene oxide) or polysiloxanes, having a number average molecular weight of, say, more than 300, provide rubbery reworkable crosslinked resins. When the polymeric flexible chain has a number average molecular weight in the order of 1500–5000 or more, reworkable crosslinked resins may be obtained which could replace thermoplastic rubbers.

Accordingly, suitable crosslinking agents of this kind are the bis-maleimido-capped poly(alkylene oxide)s, such as poly(ethylene oxide)s or poly(propylene oxide)s, and bismaleimido-capped polysiloxanes, for example the bismaleimides of polysiloxanes of the general formula $H_2N-CH_2[-O-SiR_2]_n-O-CH_2-NH_2$, wherein n is an integer, on average, of more than 10 and in particular in the range of 20–70, and each R is independently an alkyl group, in particular having up to 5 carbon atoms, preferably a methyl group. Very good results can be obtained with the bismaleimide of bisamino-capped poly(propene oxide), in particular having a number average molecular weight of at least 300, more in particular in the range of 1500–5000.

Low-molecular weight bridging groups, i.e. bridging groups which typically have up to 20 carbon atoms in the bridge, may also be used. Cycloaliphatic and aromatic bridging groups render the bridging groups rigid. Low-molecular weight cycloaliphatic and aromatic bridging groups tend to provide re-moldable crosslinked resins which are hard and brittle, and have a relatively high glass transition temperature. Examples of cycloaliphatic and aromatic low-molecular weight bridging groups are groups containing a norbornane skeleton in the bridge, 1,3-phenylene groups and groups of the following formulae: —f—CH$_2$—f—, —f—O—f—O—f—, —f—O—f—SO$_2$—f—O—f— and —f—C(CH$_3$)$_2$—f—, wherein —f— denotes a 1,4-phenylene group. Other suitable bridging groups are alkylene and oxycarbonyl (ester) groups and combinations thereof. Suitable low-molecular weight crosslinking agents are, for example, the bismaleimides of hydrazine, 2,4-diaminotoluene, hexamethylenediamine, dodecamethylenediamine, diamines of the general formula:

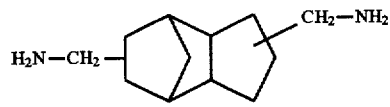

and bisamino-capped (poly)siloxanes of low molecular weight, such as polysiloxanes of the general formula $H_2N-CH_2[-O-SiR_2]_n-O-CH_2-NH_2$, wherein n ranges, on average, from 1 to 10, preferably from 1 to 5 and the groups R are preferably methyl groups. An isomer mixture of the diamines of above formula is commercially available from HOECHST. Very good results can be obtained with bis(4-maleimidophenyl)methane and dimethylbis[(N-maleimidomethyl)oxy]silane.

Other suitable crosslinking agents on the basis of maleic anhydride are compounds of the general formula:

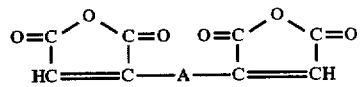

wherein A denotes a bridging group as described hereinbefore, in particular bridging group having up to 20 carbon atoms in the bridge. More in particular the bridging group A is an alkylene group, such as a hexamethylene group, or groups —D—O—CO— or —CO—O—D—O—CO— wherein D denotes a bivalent hydrocarbyl group, for example an alkylene group, such as a hexamethylene group.

Again other suitable crosslinking agents are polyesters based on butynedioic acid and a diol, such as ethylene glycol, a poly(ethylene glycol), propylene glycol or a poly (propylene glycol). These polyesters may be low molecular weight crosslinking agents, such as described hereinbefore, or they may have a number average molecular weight of, for example, more than 400, such as in the range of 2000–6000.

The present invention also relates to crosslinking agents such as bismaleimido-capped poly(alkylene oxide)s, in particular bismaleimido-capped poly(propene oxide)s. Such agents have a number average molecular weight of at least 300, preferably in the range of 1500–5000. The bismaleimides of polysiloxanes have the general formula $H_2N-CH_2[-O-SiR_2]_n-O-CH_2-NH_2$, wherein n is an integer of at least 1 and each R is independently an alkyl group, in particular having up to 5 carbon atoms, preferably a methyl group. The bismaleimido-capped polysiloxanes can be prepared by N-hydroxymethylation of maleimide with formaldehyde and subsequent reaction with the appropriate dichloro-dialkylsilane in the presence of base and water using generally known methods.

As noted above, certain embodiments relate to a crosslinking agent which comprises in its molecular structure 2,5-dialkylfuran moieties. In this crosslinking agent the 2,5-dialkyl substituted furan groups can be connected to one another via a chemical bond or via a bridging group. The nature of this bridging group is generally the same as the bridging group of the crosslinking agents which comprise two or more dienophiles, as described hereinbefore. Examples of suitable crosslinking agents are bis(5-ethylfurfuryl) adipate and the bis-amides of (5-ethylfurfuryl) acetic acid and the diamines mentioned in the preceding paragraphs.

The 2,5-dialkyl substituted furan moieties and/or moieties of a dienophile may be connected to the polymer chains by means of a chemical bond or by means of a bridging group.

This bridging group may be of the same type as the bridging groups of the crosslinking agents. Examples may be given as follows. When the polymer is a polystyrene, maleimide, as the dienophile, may be attached thereto by tin(IV)chloride catalyzed alkylation of the polystyrene with N-chloromethylmaleimide, and when the polymer is a (styrene/maleic anhydride)copolymer a 5-ethylfurfuryl group may be attached thereto by esterifying the (styrene/maleic anhydride)copolymer with 5-ethylfurfuryl alcohol in pyridine. When the polymer is a copolymer of carbon monoxide and olefinically unsaturated compounds which comprises 1,4-dicarbonyl entities in their polymer chains, 2,5-dialkylfurans and dienophiles may be attached thereto by reacting the copolymer with an appropriately substituted primary hydrocarbylamine, e.g., using the methods known from U.S. Pat. No. 3,979,374. In this reaction 1,4-dicarbonyl entities are converted into pyrrole entities which form part of the polymer chain and which are N-substituted with the substituted hydrocarbyl group. For example, a copolymer of carbon monoxide and olefinically unsaturated compounds which comprise 1,4-dicarbonyl entities may be reacted with the mono-amide of maleic acid and hexamethylenediamine or with the mono-amide of maleic acid and bis(4-aminophenyl)methane, followed by ring closure of the acid-amido moieties to maleimide moieties. This will yield a polymer having N-(6-maleimidohexyl)pyrrole or N-{4-[(4'-maleimidophenyl)methyl]phenyl}pyrrole entities in the polymer chain. When it is desired to use a polymer which contains 2,5-dialkyl substituted furan moieties and moieties of a dienophile a portion of the 1,4-dicarbonyl entities of a copolymer of carbon monoxide and olefinically unsaturated compounds may be converted into furan moieties and another portion of the 1,4-dicarbonyl entities may be converted into N-substituted pyrrole entities, of which the N-substituent comprise a dienophile.

The molecular weight of the polymer(s) on which the reworkable crosslinked resin is/are based may vary between wide limits. Suitably the polymer may have a number average molecular weight within the range of from 500, preferably from 700, to about 30,000, preferably to about 20,000.

The quantity of Diels-Alder adducts present in the thermally reworkable crosslinked resin depends on the quantity of 2,5-dialkyl furan groups and the quantity of the dienophile present in the composition from which the Diels-Alder adducts are formed. One skilled in the art will appreciate that a certain minimum quantity of Diels-Alder adducts is needed to be present to effect that the crosslinked resin is a solid material below the temperature at which the Diels-Alder adducts reverse to the 2,5-dialkyl substituted furan and the dienophile. It will also be appreciated that this minimum quantity depends on the molecular weight and the type of the polymer on which the resin is based and, if any crosslinking agent is used, on the number of dienophiles or 2,5-dialkyl furan groups per molecule (i.e. functionality) of the crosslinking agent. Lower molecular weights of the polymer will require a higher quantity of Diels-Alder adducts. The number of a Diels-Alder adducts may be lower when a crosslinking agent is used which has a higher functionality.

Generally good results can be achieved by using the 2,5-dialkyl furan-containing polymer having a furan groups to ketone groups ratio of from about 1:16 to about 4:1. The molar ratio of the 2,5-dialkyl substituted furan groups to dienophiles amounts typically from about 10:1 to about 1:5, preferably from about 5:1 to about 1:3.

The electronic package of the invention contains a substrate having a metal circuit pattern disposed on a first surface thereof; a semiconductor device having one or more electrically conductive pads on a first surface thereof and a second surface attached to the substrate by means of a die attach adhesive, preferably a thermally reworkable die attach composition, one or more electrically conductive connections between the pads on the device and metal circuit pattern of the substrate; and a thermally reworkable encapsulant covering the semiconductor device and a portion of the first surface of the substrate. The thermally reworkable encapsulant contains (a) a thermally reworkable crosslinked resin produced by reacting at least one dienophile having a functionality greater than one and at least one 2,5-dialkyl substituted furan-containing polymer, and (b) at least one filler present in an amount from about 25 to about 75 percent by weight based upon the amount of components (a) and (b) thereby providing an electronic package.

One or more semiconductor devices can be attached to the substrate with an adhesive, and covered by a glob top encapsulant. The glob top encapsulant also covers portions of the first surface of the substrate. Preferably, a thermally reworkable die attach composition and thermally reworkable encapsulant containing similar thermally reworkable resins are used as a die attach adhesive and glob top encapsulant respectively. A conventional die attach adhesive such as an epoxy-based adhesive can also be used. The thermally reworkable die attach composition preferably comprises (a) a thermally reworkable crosslinked resin produced by reacting at least one dienophile having a functionality greater than one and at least one 2,5-dialkyl substituted furan-containing polymer, and (b) at least one thermally and/or electrically conductive material present in an effective amount to provide a conducting medium, up to about 90% by weight, preferably in an amount from about 60% to about 90% by weight, of the die attach composition. The preferred thermally conducting material are such as for example, beryllia, boron nitride, aluminum oxide (single crystal), aluminum nitride coated with copper (see U.S. Pat. No. 5,288,769) and the like. Electrical contact is provided by means of incorporating electrically conductive materials (fillers) such as silver, nickel, copper and aluminum particles as well as alloys of such metals in the die attach adhesive formulation.

The substrate may be an organic, metal or ceramic substrate such as that used in a ball grid array construction, or may be a multicomponent printed circuit board. For instance, an organic printed circuit board contains an electrically insulating material, such as fiberglass-reinforced resin, typically used in a laminated construction. At least one integrated circuit die or semiconductor device is electrically and mechanically attached to electrically conductive metal traces (metal circuit patterns) on the substrate. The die or device is bonded to a region of the printed circuit board using a die attach adhesive. The die is preferentially bonded with a thermally reworkable die attach composition. The die or semiconductor device is electrically interconnected via gold, tin plated copper, or aluminum wires to electrically conductive traces on the printed circuit board substrate.

A thermally reworkable encapsulant (thermally reworkable glob top encapsulant) is deposited over the die or semiconductor device, electrically conductive connections, and a portion of the substrate. The encapsulant as described above is deposited while in a liquid state and flowed to cover the affected areas. The thermally reworkable encapsulant can be dispensed on the substrate by using standard equipment such as a syringe or a motionless mixer that mixes the components of the thermally reworkable encapsulant and precisely dispenses the composition on the substrate.

After the deposition of the encapsulant, it is cured to a solid form by cooling down to a temperature that is sufficient to solidify the encapsulant.

The thermally reworkable encapsulant typically contains filler from about 25%, preferably about 40%, to about 75%, preferably to about 60% by weight of the binder based on the weight of the composition (resin and filler). The filler can be any inorganic filler suitable for semiconductor packaging applications such as high purity fused or amorphous silica or synthetic glass commercial fillers. The filler can be optionally treated with a coupling agent such as a silane.

Typically the filler and the resin should be at least substantially free from the ionic impurities chloride, sodium and potassium (less than 20 ppm each). The process of the invention provides a process which eliminates most of the ionic impurities found in the traditional processes using epoxy resin based binders.

Further, the thermally reworkable encapsulant can be worked and/or reworked at a temperature where the thermally reworkable encapsulant melts (becomes liquid). Typically, the thermally reworkable encapsulant can be worked and/or reworked at a temperature within the range from about 100° C., preferably from about 130° C., to about 250° C., preferably to about 200° C. If the resin is heated for an extended period of time at high temperature, for instance, for 12 hours at 200° C., the resin undergoes irreversible crosslinking and it is no longer thermally reversible.

In order to rework the electronic package, the thermally reworkable encapsulant is heated to a temperature which is sufficiently high to convert the thermally reworkable encapsulant into a liquid thereby providing a liquid composition that can be cleaned from the substrate easily. If the semiconductor device is attached to the substrate by means of a thermally reworkable die attach composition, the device can also be removed from the substrate by the application of heat to convert the thermally reworkable die attach composition into a liquid, thereby providing a device-removed substrate. If the die attach composition consists of a crosslinked resin system, a destructive method such as die shear is used to remove the device from the substrate. The electrically conductive connections are broken off when the device is removed. Then another semiconductor device may be attached to the device-removed board if desired by means of an adhesive, preferably a thermally reworkable die attach composition, then covering the another semiconductor device and a portion of the substrate surface with a fresh thermally reworkable encapsulant as described above and then cooling the fresh reworkable encapsulant to a temperature which is sufficiently low to solidify the resin thereby producing a reworked electronic package.

The thermally reworkable encapsulant can be postbaked to enhance the thermal and mechanical properties (e.g., glass transition temperature and mechanical strength). In order to preserve the thermal reversibility of the crosslinked resin, the thermally reworkable composition can be post-heated to a temperature within the range from about 50° C., preferably from about 80° C., to about 200° C., preferably to about 160° C. for a period of time up to about 4 hours or more. If thermal reversibility is not required the binder composition can be postbaked at a temperature within the range of from about 150° C., preferably from about 180° C., to about 300° C., preferably to about 250° C. for a period of time up to about four hours to improve the thermal properties.

ILLUSTRATIVE EMBODIMENT

The following illustrative embodiments describe the novel thermally reworkable electronic package of the invention and are provided for illustrative purposes and are not meant as limiting the invention.

EXAMPLE 1

An autoclave was charged with methanol and propene (approximately 1.7:1 weight ratio), heated to 90° C., and then charged with carbon monoxide to a pressure of 72 bar. A catalyst solution of palladium acetate, 1,3-bis-(diethylphosphino)propane, trifluoromethane sulfonic acid, in a weight ratio of 0.6:0.62:1 and 0.3 pyridine, in a tetrahydrofuran, and methanol solution (15:1 weight ratio) were injected and the reactor pressure was maintained constant at 72 bar during the reaction by means of a continuous supply of carbon monoxide. Removal of solvent yielded an alternating propene/CO copolymer with a number average molecular weight of 733.

EXAMPLE 2

An alternating propene-CO copolymer with a number average molecular weight of 733 made as described in Example 1 was dissolved in toluene and cyclized in the presence of a catalytic amount of p-toluene sulfonic acid by heating at reflux until no more water was collected in the distillate. The resulting polymer was analyzed by C-13 NMR which showed that 82% of the ketones in the starling polyketone were cyclized to furans (furan:ketone ratio 2.28:1) by the appearance of C-13 NMR signals centered at around 107, 114, 147 and 153 ppm.

EXAMPLE 3

A system was made by blending the furanized polyketone made in Example 2 and a stoichiometric amount of methylene dianiline bismaleimide (Compimide Resin MDAB, Technochemie Gmbh) at 340° F. The blend was removed from the gel plate and stored at room temperature. A solder-masked 8-ply (epoxy- glass fabric) printed circuit board with a die-attached chip was placed on the gel plate at 340° F. and allowed to heat up to the temperature. A small amount of the blend was dispensed over the chip and allowed to "glob" over the chip. The board was then cooled to ambient temperature to allow the encapsulant to become a crosslinked solid. The board was placed back on the gel plate and allowed to heat for one minute. The glob was seen to be a low viscosity uncrosslinked liquid. The board was removed from the gel plate and the encapsulant went back to its solid crosslinked state.

EXAMPLE 4

A blend was made by mixing the furanized polyketone made in example (2), a stoichiometric amount of MDAB at 340° F. and silica filler (50.4% by weight of the total formulation). The blend was removed from the gel plate and stored at room temperature. A solder-masked 8-ply (epoxy-glass fabric) printed circuit board with a die-attached chip was placed on the gel plate at 340° F. and allowed to heat up to the temperature. A small amount of the blend was dispensed over the chip and allowed to "glob" over the chip. The board was then cooled to ambient temperature to allow the encapsulant to become a crosslinked solid. The board was placed back on the gel plate and allowed to heat for a minute. The glob was seen to be an uncrosslinked liquid. The board was removed from the gel plate and the encapsulant went back to its solid crosslinked state.

EXAMPLE 5

An alternating olefin-CO copolymer (27% ethylene, 73% propylene) with a number average molecular weight of 1472 was prepared in a similar manner to Example 1 from propene and ethylene. The copolymer was dissolved in toluene and cyclized in the presence of a catalytic amount of p-toluene sulfonic acid by heating at reflux. The resulting polymer was analyzed by C-13 NMR which showed that 56% of the ketones in the starting polyketone were cyclized to furans (furan:ketone ratio 0.64:1).

EXAMPLE 6

A gel plate was set to 340° F. and the furanized polyketone made in Example 5 was dispensed onto the plate. A stoichiometric amount of toluene diamine bismaleimide (Compimide Resin TDAB, Technochemie Gmbh) was blended with the furanized polyketone until a homogeneous blend was obtained. The blend was removed from the el plate and stored at room temperature.

EXAMPLE 7

An ICI cone and plate viscometer was set to a temperature of 175° C. and allowed to equilibrate to the set point. A small amount of blend from Example 6 was placed on the plate and allowed to come up to temperature. The cone was brought down and spun to obtain a good film between the cone and plate. This was verified by lifting the cone up to check for good film formation. Subsequently the blend was allowed to equilibrate for 90 seconds and two viscosity readings were taken while the cone was rotating at a fixed speed. The cone was lifted up and the blend retrieved from both the cone and plate. The blend was allowed to cool at room temperature to a crosslinked solid. The above sequence of events was repeated three times with the same blend i.e. load on ICI cone and plate, measure viscosity at 175° C., remove blend, cool to room temperature. The three consecutive readings for viscosity were 3–5 poise, 3–5 poise and 3–5 poise. This experiment shows that the blend went from a crosslinked state at room temperature to a low viscosity uncrosslinked liquid at 175° C.

EXAMPLE 8

The furanized polyketone made in Example 5 was blended with a stoichiometric amount of TDAB at 340° F. on a gel plate. The blend was cooled to room temperature. This blend was further mixed with silica filler (50% by weight of total formulation) homogeneously at 340° F. The filled formulation was then removed from the gel plate and cooled to room temperature.

EXAMPLE 9

An ICI cone and plate viscometer was set to a temperature of 175° C. and allowed to equilibrate to the set point. A small amount of blend from Example 8 was placed on the plate and allowed to come up to temperature. The cone was brought down and spun to obtain a good film between the cone and plate. This was verified by lifting the cone up to check for good film formation. Subsequently the blend was allowed to equilibrate for 90 seconds and two viscosity readings were taken while the cone was rotating at a fixed speed. The cone was lifted up and the blend retrieved from both the cone and plate. The blend was allowed to cool at room temperature to a crosslinked solid. The above sequence of events was repeated three times with the same blend i.e. load on ICI cone and plate, measure viscosity at 175° C., remove blend, cool to room temperature. The three consecutive readings for viscosity were 20–25 poise, 20–25 poise and 25–30 poise. This experiment shows that the blend went from a crosslinked state at room temperature to an uncrosslinked liquid at 175° C.

EXAMPLE 10

An alternating propene-CO copolymer with a number average molecular weight of 1616 prepared in a similar manner to Example 1, except that 1,3-bis(di-o-methoxyphenylphosphino)propane was used in the catalyst solution instead of 1,3-bis(diethylphosphino)propane. The copolymer was dissolved in toluene and cyclized in the presence of a catalytic amount of p-toluene sulfonic acid by heating at reflux until no more water was collected in the distillate. The resulting polymer was analyzed by C-13 NMR which showed that 57% of the ketones in the starting polyketone were cyclized to furans (furan:ketone ratio 0.66:1).

EXAMPLE 11

Furanized polyketone made in Example 10 and a stoichiometric amount of TDAB along with 6.5% by weight of phenothiazine were heated to 180° C., mixed and poured in a ⅛ inch thick metal mold. The mold was cooled quickly and the resulting casting was tested for properties. The flexural modulus of the sample was found to be 628 ksi, a value similar to that of a crosslinked epoxy made with bisphenol-A epoxy cured with an anhydride hardener. The dielectric constant and dissipation factor were 3.17 and 0.013 respectively.

EXAMPLE 12

Furanized polyketone made in Example 10 was reacted with a 2:1 stoichiometric ratio of MDAB, 0.1 mole of phenothiazine/mole of MDAB and 0.015 gm of 2-ethyl hexanoic acid/gm of furanized polyketone. A differential scanning calorimetry scan was performed on the sample at a ramp rate of 20° C./min. The onset of the glass transition temperature occurred at 105° C.

EXAMPLE 13

Furanized polyketone made in Example 5 was reacted with a stoichiometric amount of TDAB and 0.1 moles of phenothiazine/mole of TDAB on a gel plate at 340° F. This sample was ground and placed in a Parr bomb with water in a 10:1 ratio (water:sample). The Parr bomb was kept at 60° C. for 20 hours and the water extract was analyzed for ions by ion chromatography. The extract contained 14 ppm acetate, <3 ppm glycolate, formate, propionate, <0.25 ppm chlorine, <1 ppm nitrate, 1.7 ppm sulfate, 4.8 ppm sodium, 0.8 ppm magnesium, 2.5 ppm calcium and 0.2 ppm ammonium ion.

We claim:
1. An electronic package comprising:
  a substrate having a metal circuit pattern disposed on a first surface thereof;
  a semiconductor device having first and second surfaces wherein said first surface includes at least one electrical pad and wherein said second surface is attached to said first surface of said substrate by means of a die attach adhesive;
  at least one electrically conductive connection between said at least one electrical pad on said semiconductor device and said metal circuit pattern of said substrate; and
  a thermally reworkable encapsulant covering said semiconductor device and a portion of said first surface of said substrate;

said thermally reworkable encapsulant comprising
  (a) a thermally reworkable crosslinked resin produced by reacting at least one dienophile having a functionality greater than one and at least one 2,5-dialkyl substituted furan-containing polymer, and
  (b) at least one filler present in an amount from about 25 to about 75 percent by weight based on the total amount of components (a) and (b).

2. The electronic package of claim 1 wherein the die attach adhesive a thermally reworkable die attach composition comprising:
  (a) a thermally reworkable crosslinked resin produced by reacting at least one dienophile having a functionality greater than one and at least one 2,5-dialkyl substituted furan-containing polymer, and
  (b) at least one thermally conductive material or electrically conductive material, or mixtures thereof, present in an amount from about 60% to about 90% by weight of the die attach composition.

3. The electronic package of claim 2 wherein the thermally reworkable crosslinked resin of the thermally reworkable encapsulant is reworkable at a temperature within the range of from about 100° C. to about 250° C.

4. The electronic package of claim 3 wherein the at least one dienophile of the thermally reworkable encapsulant is an alkyne having electron withdrawing groups attached to both sides of an ethyne moiety.

5. The electronic package of claim 4 wherein the at least one dienophile of the thermally reworkable encapsulant is selected from the group consisting of compounds containing but-2-ene-1,4-dione moieties in 5-membered rings, and compounds containing but-2-ene-1,4-dione moieties in 6-membered rings.

6. The electronic package of claim 3 wherein the at least one dienophile of the thermally reworkable encapsulant is a cyclic derivative of maleic anhydride.

7. The electronic package of claim 4 wherein the thermally reworkable resin of the thermally reworkable encapsulant further comprises a residue of a cross-linking agent selected from the group consisting of, bismaleimido-capped poly(alkylene oxide)s, bismaleimido-capped polysiloxanes, bismaleimides of hydrazine, 2,4-diaminotoluene, hexamethylenediamine, dodecamethylenediamine, and substituted and unsubstituted diamines of the formula:

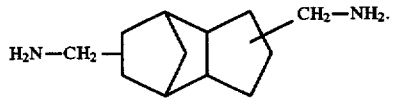

8. The electronic package of claim 1 wherein the 2,5-dialkyl substituted furan-containing polymer is produced by reacting carbon monoxide with at least one olefinically unstaturated compound.

9. The electronic package of claim 8 wherein the olefinically unsaturated compound is an aliphatic α-olefin.

10. The electronic package of claim 9 wherein the α-olefin is propene and the die attach adhesive is a thermally reworkable die attach composition.

11. The electronic package of claim 3 wherein the polymer from which the reworkable crosslinked resin of the thermally reworkable encapsulant is produced has a number average molecular weight in the range of 500–30,000.

12. The electronic package of claim 5 wherein the 2,5-dialkyl furan-containing polymer of the thermally reworkable encapsulant has a furan groups to ketone groups ratio of from about 1:16 to about 4:1.

13. The electronic package of claim 3 wherein 2,5-dialkyl substituted furan groups in the 2,5-dialkyl substituted furan-containing polymer of the thermally reworkable encapsulant and the at least one dienophile of the thermally reworkable encapsulant are combined in a molar ration of from about 10:1 to about 1:5.

14. The electronic package of claim 3 wherein the thermally reworkable crosslinked resin of the thermally reworkable encapsulant comprises moieties of a 2,5-dialkyl substituted furan and moieties of a dienophile.

15. The electronic package of claim 1 further comprising (c) a free radical inhibitor, or an ion scavenger or mixtures thereof.

16. A process of preparing an electronic package comprising the steps of:
  providing a substrate having a metal circuit pattern disposed on a first surface thereof;
  providing at least one semiconductor device, said at least one semiconductor device having a first surface and a second surface, said first surface including at least one electrical pad;
  dispensing a die attach adhesive on a portion of said first surface of said substrate;
  attaching said second surface of said at least one semiconductor device to said first surface of said substrate by means of said die attach adhesive;
  attaching at least one electrically conductive connection between said at least one pad on said semiconductor device and said metal circuit pattern of said substrate; and
  covering said semiconductor device, said electrically conductive connection, and a portion of said first surface of said substrate with a thermally reworkable encapsulant thereby providing an electronic package;
  said thermally reworkable encapsulant comprising
  (a) a thermally reworkable crosslinked resin produced by reacting at least one dienophile having a functionality greater than one and at least one 2,5-dialkyl substituted furan-containing polymer, and
  (b) at least one filler present in an amount from about 25 to about 75 percent by weight based on the amount of components (a) and (b).

17. The process of claim 16 wherein the die attach adhesive is a thermally reworkable die attach composition comprising:
  (a) a thermally reworkable crosslinked resin produced by reacting at least one dienophile having a functionality greater than one and at least one 2,5-dialkyl substituted furan-containing polymer, and
  (b) at least one thermally conductive material or electrically conductive material, or mixtures thereof, present in an amount from about 60% to about 90% by weight of the die attach composition.

18. The process of claim 16 wherein the crosslinked resin is reworkable at a temperature within the range of from about 100° C. to about 250° C.

19. The process of claim 17 wherein the at least one dienophile of the thermally reworkable encapsulant is an alkyne having electron withdrawing groups attached to both sides of an ethyne moiety.

20. The electronic package of claim 19 wherein the at least one dienophile of the thermally reworkable encapsulant is selected from the group consisting of compounds containing but-2-ene-1,4-dione moieties in 5-membered rings, and compounds containing but-2-ene-1,4-dione moieties in 6-membered rings.

21. The electronic package of claim 18 wherein the at least one dienophile of the thermally reworkable encapsulant is a cyclic derivative of maleic anhydride.

22. The process of claim 17 wherein the 2,5-dialkyl substituted furan-containing polymer of the thermally reworkable encapsulant is produced by reacting carbon monoxide with at least one olefinically unstaturated compound.

23. The process of claim 22 wherein the olefinically unsaturated compound is an aliphatic α-olefin and the die attach composition is a thermally reworkable die attach composition.

24. The process of claim 17 further comprising the steps of:

heating said thermally reworkable encapsulant of said electronic package at a temperature which is sufficiently high to convert said thermally reworkable encapsulant into a liquid thereby providing a liquid encapsulant;

removing said liquid encapsulant;

heating said thermally reworkable die attach composition of said electronic package at a temperature which is sufficiently high to convert said thermally reworkable die attach composition into a liquid thereby providing a liquid die attach composition;

removing said semiconductor device from said liquid die attach composition on said substrate; and removing at least a portion of said liquid die attach composition from said substrate thereby providing a fresh surface.

25. The process of claim 24 further comprising the steps of:

providing a second semiconductor device, said second semiconductor device having first and second surfaces, said first surface including at least one electrical pad;

dispensing a die attach adhesive on a portion of said fresh surface of said substrate;

attaching said second surface of said second semiconductor device to said fresh surface of said substrate by means of said die attach adhesive;

attaching an electrically conductive connection between said at least one electrical pad of said second semiconductor device and said metal circuit pattern of said substrate; and covering said second semiconductor device, said electrically conductive connection, and a portion of said surface of said substrate with a fresh thermally reworkable encapsulant;

said fresh thermally reworkable encapsulant comprising
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based upon the amount of components (a) and (b), and optionally, cooling the fresh reworkable encapsulant covering the device to a temperature which is sufficiently low to solidify the resin thereby producing a reworked electronic package.

26. The process of claim 25 wherein the crosslinked resin is heated at a temperature within the range of from about 100° C. to about 250° C.

27. The process of claim 26 wherein the 2,5-dialkyl substituted furan-containing polymer is produced by furanizing a copolymer of carbon monoxide and at least one olefinically unsaturated compound.

28. The process of claim 25 further comprising the step of heating the assembly at a temperature within the range of 70° C. to 200° C. for a period of up to 4 hours.

29. The process of claim 25 further comprising the step of heating the assembly at a temperature within the range of 150° C. to 300° C. for a period of up to 4 hours.

30. A method for reworking an electronic package comprising the steps of:

heating the thermally reworkable encapsulant of an electronic package comprising a substrate having a metal circuit pattern disposed on a first surface thereof;

a semiconductor device having first and second surfaces wherein said first surface includes at least one pad and wherein said second surface is attached to said first surface of said substrate by means of a thermally reworkable die attach composition;

at least one electrically conductive connection between said at least one pad on said semiconductor device and said metal circuit pattern of said substrate; and a thermally reworkable encapsulant covering said semiconductor device and a portion of said first surface of said substrate;

said thermally reworkable encapsulant comprising
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based on the total amount of components (a) and (b), at a temperature which is sufficiently high to convert said thermally reworkable encapsulant into a liquid thereby providing a liquid encapsulant;

removing said liquid encapsulant;

heating the thermally reworkable die attach composition of said electronic package at a temperature which is sufficiently high to convert said thermally reworkable die attach composition into a liquid thereby providing a liquid die attach composition;

removing said semiconductor device from said liquid die attach composition on said substrate; and removing at least a portion of said liquid die attach composition from said substrate thereby providing a fresh surface.

31. The process of claim 30 further comprising the steps of:

providing a second semiconductor device, said second semiconductor device having first and second surfaces, said first surface including at least one electrical pad;

dispensing a die attach adhesive on a portion of said fresh surface of said substrate;

attaching said second surface of said second semiconductor device to said fresh surface of said substrate by means of said die attach adhesive;

attaching an electrically conductive connection between said at least one electrical pad of said second semiconductor device and said metal circuit pattern of said substrate; and covering said second semiconductor device, said electrically conductive connection, and a portion of said surface of said substrate with a fresh thermally reworkable encapsulant;

said fresh thermally reworkable encapsulant comprising
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based upon the amount of components (a) and (b), and optionally, cooling the fresh reworkable encapsulant covering the device to a temperature which is sufficiently low to solidify the resin thereby producing a reworked electronic package.

32. The process of claim 31 wherein the crosslinked resin is heated at a temperature within the range of from about 100° C. to about 250° C.

33. The process of claim 31 wherein the 2,5-dialkyl substituted furan-containing polymer is produced by furanizing a copolymer of carbon monoxide and at least one olefinically unsaturated compound.

* * * * *